United States Patent

Alvarez et al.

Patent Number: 6,011,981
Date of Patent: *Jan. 4, 2000

[54] OXIDE SUPERCONDUCTOR MULTILAYERED FILM AND OXIDE SUPERCONDUCTOR JOSEPHSON DEVICE

[75] Inventors: Gustavo Alvarez; Furen Wang; Jian-Guo Wen; Naoki Koshizuka; Youichi Enomoto; Tadashi Utagawa, all of Tokyo; Shoji Tanaka, Koto ku, all of Japan

[73] Assignee: International Superconductivity Technology Center, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/814,172

[22] Filed: Mar. 10, 1997

[30] Foreign Application Priority Data

Mar. 12, 1996 [JP] Japan ................................. 8-055221
Jun. 18, 1996 [JP] Japan ................................. 8-156627

[51] Int. Cl.$^7$ ..................................... H01L 39/22
[52] U.S. Cl. .......................... 505/190; 505/238; 505/702; 257/33; 257/35
[58] Field of Search ..................... 505/190, 702, 505/329, 238, 474, 475; 427/62; 257/33, 35

[56] References Cited

U.S. PATENT DOCUMENTS 5,087,605  2/1992  Hegde et al. ........................ 505/1

OTHER PUBLICATIONS

Badaye et al, Appl. Phys. lett. 66(16) Apr. 1995, p. 2131–2133.
Qiu et al, J. Appl. Phys. 72(5), Sep. 1992, p. 2072–2074.
Alvarez et al, Appl. Phys. lett. 69(18) Oct. 1996, p. 2743–2745.
Growth and Properties of $NdBa_2Cu_3O_{7-\delta}/PrBa_2Cu_3O_{7-\delta}$ Quasi–Homoepitaxial Multilayers,—Gustavo A. Alvarez et al. Jpn. J. Appl. Phys. vol. 35 pp. L 1050–L 1052, Part 2, No. 8B, Aug. 15, 1996.

*Primary Examiner*—Roy V. King
*Attorney, Agent, or Firm*—Armstrong, Westerman, Hattori, McLeland & Naughton

[57] ABSTRACT

An oxide superconducting multilayered thin film structure having a laminated layer structure of oxide superconductor thin film layers and non-superconductor thin film layers constituted by a combination of material groups for making strain free interfaces among both thin film layers. For example, an oxide superconductor multilayered film constituted by a laminated layer structure where thin films of an oxide superconductor represented by the chemical formula of $M'Ba_2Cu_3O_{7-\delta}$ (M'; a rare earth element of Nd, Sm, Eu or the like or an alloy of these, $\delta$; oxygen depletion amount) and thin films of an oxide represented by the chemical formula of $M^*Ba_2Cu_3O_{7-\delta}$ (M*; an element of Pr, Sc or the like or an alloy of these, $\delta$; oxygen depletion amount) are alternately stacked. The oxide thin films are thin films fabricated by a pulsed laser deposition process or a sputtering process. A Josephson device can be provided by using the multilayered film.

9 Claims, 10 Drawing Sheets

(a) TOTAL DIAGRAM

Fig. 10

(b) PARTIAL DIAGRAM

Fig. 11

OXIDE SUPERCONDUCTOR MULTILAYERED FILM AND OXIDE SUPERCONDUCTOR JOSEPHSON DEVICE

BACKGROUND OF THE INVENTION

The present invention relates to an oxide superconducting multilayer structure made with superconductive and non-superconductive thin films and constituted by a combination of material groups for making interfaces among the thin film layers strain free and a Josephson device used in a high speed superconductive circuit, a highly sensitive magnetic field sensor or an electromagnetic wave detector, particularly to a technology effective in applying to an integrated circuit in an electronic instrument of communication and information processing.

A multilayered film structure constituted by a superconductor and a normally conductive metal is an important composite material group in view of achieving large current application or high frequency current application since the magnetic field penetration length can effectively be utilized. Therefore, an investigation is widely carried out on the multilayered structure fabrication process also in a metal superconductor group having a low critical temperature Tc. In addition thereto, in respect of an oxide superconductor having an especially high critical temperature Tc, the crystal structure per se is in a layered form and many researches have been carried out with respect to a multilayered film also in view of studying the mechanism of superconductivity.

Further, this technology is expected to be a basis in realizing a tunnel junction of a laminated layer type which becomes a basic device in electronic application. Incidentally, it is advantageous in view of crystal growth to combine the same kinds of materials in realizing a multilayered thin film. Therefore, in respect of a superconductor having a 123 structure having a representative example of $YBa_2Cu_3O_{7-\delta}$ ($\delta$; Oxygen depletion amount), $PrBa_2Cu_3O_{7-\delta}$ showing no superconductivity irrespective of the fact that the compound is provided with approximately the same crystal structure, is selected and many fabrication results have been reported. However, in almost all of the conventional cases, $YBa_2Cu_3O_{7-\delta}$ of which high quality thin film stacking process has been established as a superconductor layer was selected and fabricated.

The layer by layer technology of an oxide superconducting multilayered thin film structure concerning the above-mentioned conventional technology is disclosed in a paper by Hideomi Koinuma, Mamoru Yoshimoto, "Applied Physics", volume 60, No. 5 (1991), pp. 433–442.

Further, the technology of laminating high quality $YBa_2Cu_3O_{7-\delta}$ and $PrBa_2Cu_3O_{7-\delta}$, is disclosed in a paper by Hisamaru Bando, Takahito Terashima, "Applied Physics", volume 60, No. 5 (1991), pp. 474–477.

Also, the Josephson composite fabrication technology of $YBa_2Cu_3O_{7-\delta}/PrBa_2Cu_3O_{7-\delta}/YBa_2Cu_3O_{7-\delta}$ is disclosed in a paper by Jiro Yoshida, Tatsunori Hashimoto, "Applied Physics", volume 61, No. 6 (1992), pp. 494–497.

Further, a superconductive tunnel junction shows a quantum effect and becomes a potential candidate in applying the quantum phenomena in an electronic device. Conventionally, a tunnel type Josephson device has been formed by using superconductive materials of Pb, Nb, NbN etc. As tunnel barriers, PbO, $Nb_2O_3$ etc. which are oxides of superconductive materials, or substances different from superconductive materials, for example, Al, $Al_2O_3$, MgO, $SiO_2$ etc. have been used. Concerning a tunnel type Josephson device having such a material composition, excellent properties are provided and application thereof to a superconductive memory, a logic circuit, a magnetic field sensor and millimeter wave detection has been progressed. However, the critical temperature of superconductivity in such a material group is as low as 15 K or less, cooling to an extremely low temperature is necessary, the cost required in the cooling is increased, the facility is magnified and therefore, it is difficult to simply use the tunnel type Josephson device.

In the meantime, superconductive materials having the critical temperature of superconductivity of a liquid nitrogen temperature or higher have been developed in oxide superconductors and the like whereby the materials can be utilized by an inexpensive cooling means. Hence, researches aiming at tunnel type Josephson devices have been progressed. Especially, many researches have been carried out on laminated layer thin films also in view of revealing the mechanism of superconductivity since the crystal structure per se is lamellar in oxide superconductors having high Tc, an intrinsic junction property is observed and so on.

However, with respect to Josephson devices using artificially fabricated oxide superconductive materials, although there have been reports on fabrication thereof of a weak bonding type where controlling of properties is difficult, there has been no report on fabrication thereof in a tunnel type where controllability is excellent. It is conceived that the superconducting coupling between -superconductive electrodes becomes weak due to a deterioration by interdiffusion within the barrier layer since the fabrication temperature of oxide superconductive thin films is as high as 600° C. and the coherent length is short.

It is advantageous in view of crystal growth to combine the same kind of materials for realizing a laminated layer structure. Therefore, in respect of superconductors having a 123 structure with a representative example of $YBa_2Cu_3O_{7-\delta}$, $PrBa_2Cu_3O_7$ showing no superconductivity despite approximately the same crystal structure, is selected and many fabrication results have been reported. However, in almost all of the conventional cases, $YBa_2Cu_3O_{7-\delta}$ of which high quality thin film stacking process has been established is selected and fabricated as a superconductor layer.

In the case of $YBa_2Cu_3O_{7-\delta}$, many screw dislocations due to misfit strain in respect of a substrate are observed, causing problems in the surface flatness as well as the stability. In addition thereto, the lattice match performance in respect of $PrBa_2Cu_3O_7$ is not so excellent. It is known that according to an oxide superconductor, the oxygen depletion amount is increased by the lattice strain whereby the superconductive property is deteriorated. Actually, the critical temperature Tc of an a-axis oriented film on a substrate of $SrTiO_3$ single crystal is restrained to a low value by the effect of strain. In this way, stresses are accumulated at the inside of a multilayered film of $YBa_2Cu_3O_{7-\delta}$ and $PrBa_2Cu_3O_7$ and accordingly, high quality superconducting properties are difficult to achieve.

The inventors have found the following problems as a result of investigating the conventional technologies.

Many screw dislocations due to strains are observed in the conventional material of $YBa_2Cu_3O_{7-\delta}$, thereby causing a problem in the surface flatness that is an indispensable condition for realizing a multilayered film. In addition thereto, the lattice match performance thereof in respect of $PrBa_2Cu_3O_{7-\delta}$ is not so excellent. It is known that in an oxide superconductor the oxygen depletion amount is increased by lattice strain whereby the superconductivity is deteriorated. Actually, the critical temperature Tc of the a-axis oriented film on the substrate of $SrTiO_3$ single crystal is restrained at a low value by the effect of strain. In this way, stresses are accumulated at the inside of the multilayered film of $YBa_2Cu_3O_{7-\delta}$ and $PrBa_2Cu_3O_{7-\delta}$ whereby high quality superconductivity is difficult to attain.

That is, an oxide superconductor is provided with a low concentration of carriers and accordingly, electric properties thereof are strongly dependent on the content of oxygen supplying hole carriers. In the meantime, the oxygen amount is closely related to the lattice strain. Accordingly, the oxygen depletion is caused under a state where the strains are applied whereby the superconductive property is deteriorated.

Meanwhile, when different materials are combined, internal strain is generally caused from bonded interfaces due to a difference in lattice constants or thermal expansion coefficients. Thereby, not only the mechanical strength is weakened but the superconductive property is deteriorated in the oxide superconductive material. Hence, the inventors found that it was important in realizing the superconductivity having high function to reduce as small as possible the strains in making such a laminated structure.

It is an object of the present invention to provide a superconductive multilayered thin film structure having high quality dispensing with internal stresses since it is constituted by layers having almost perfect lattice matching.

It is an object of the present invention to provide a superconductive wiring where a large current can be made to flow.

Further, it is another aim of the present invention to provide a Josephson device by selecting a superconductor, for example, $NdBa_2Cu_3O_7$ having a lattice constant that is approximately equal to that of a $PrBa_2Cu_3O_7$ layer of a non-superconductor centering thereon thereby realizing a laminated layer structure having low internal stress and accordingly, constituting the high critical temperature Tc thereby providing a tunnel type property by an oxide superconductor thin film.

SUMMARY OF THE INVENTION

A simple explanation will be given of representative embodiments disclosed by the application as follows.

(1) The invention provides an oxide superconducting multilayered thin film structure having a layer structure laminated with oxide superconductor thin film layers and non-superconductor thin film layers, comprising a combination of material groups whereby interfaces among the thin film layers are provided with no strain or substantially no strain.

(2) The invention provides an oxide superconductor multilayered film comprising a laminated layer structure produced by alternately stacking oxide superconductor thin films represented by chemical formula of $M'Ba_2Cu_3O_{7-\delta}$ (M' designates a rare earth element of Nd, Sm, Eu or the like or an alloy of these and $\delta$ designates an oxygen depletion amount) and oxide thin films represented by chemical formula of $M^*Ba_2Cu_3O_{7-\delta}$ ($M^*$ designates an element of Pr, Sc or the like or an alloy of these and $\delta$ designates an oxygen depletion amount).

(3) The oxide thin film in item (2) is a thin film fabricated by a pulsed laser deposition or a sputtering process.

According to the above-described means, the superconductivity having high function can be realized since the strain at the interface between the thin film layers can be reduced to zero or substantially zero because the material is provided with the laminated structure of the oxide superconductor thin film layers and the non-superconductor thin film layers and the interfaces among both thin film layers comprises a combination of material groups whereby the strain of the interfaces is made to zero or to substantially zero.

For example, an oxide superconducting multilayered thin film structure having small internal stress and high critical temperature Tc can be realized by selecting a superconductor having the lattice constant which is approximately equal to that of a $PrBa_2Cu_3O_{7-\delta}$ layer of a non-superconductor centering on the value, for example, $NdBa_2Cu_3O_{7-\delta}$.

Further, a junction of the Josephson device in accordance with the present invention, is provided with a laminated structure where the oxide superconductor thin film layers and the non-superconductor thin film layers are alternately stacked and the material of the oxide superconductor and the material of the non-superconductor are selected by a combination of material groups whereby the strain caused at the interfaces among the oxide superconductor thin film layers and the non-superconductor thin film layers is substantially dispensed with. The match performance of the lattice constants of both is excellent and therefore, the device is provided with a structure having small internal strain of lattice, excellent in the superconductive properties and provided with a sharp change of properties at the interfaces whereby a junction showing a history in the current/voltage characteristic can be provided.

PREFERRED EMBODIMENTS OF THE INVENTION

Embodiment 1

Figure 1:
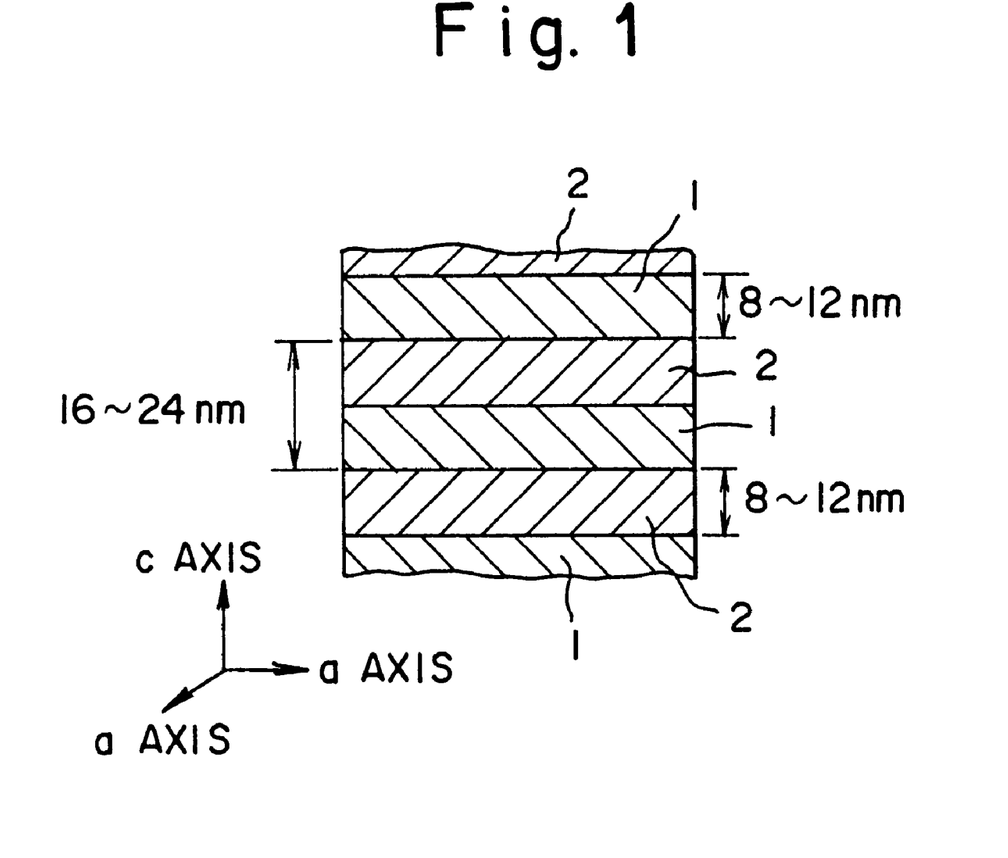
FIG. 1 is a sectional view showing the structure of an oxide superconductor multilayered film according to Embodiment 1 of the present invention.

FIG. 1 is a sectional view showing the constitution of an oxide superconductor multilayered film in accordance with Embodiment 1 of the present invention wherein numeral 1 designates a $NdBa_2Cu_3O_{7-\delta}$ (NBCO) layer and numeral 2 designates a $PrBa_2Cu_3O_{7-\delta}$ (PBCO) layer.

As shown by FIG. 1, the oxide superconductor multilayered film according to Embodiment 1 of the present invention, is constituted by a laminated layer structure where oxide superconductor thin films represented by the chemical formula of $NdBa_2Cu_3O_{7-\delta}$ oxygen depletion amount) and oxide thin films represented by the chemical formula of $PrBa_2Cu_3O_{7-\delta}$; oxygen depletion amount), are alternately stacked.

An explanation will be given of a method of fabricating the oxide superconductor multilayered film according to Embodiment 1 as follows.

A thin film of $NdBa_2Cu_3O_{7-\delta}$ is fabricated onto $SrTiO_3$ single crystal substrate by a pulsed laser deposition process. As conditions of fabricating the thin film, a polycrystal body of $NdBa_2Cu_3O_{7-\delta}$ is used as a target, the substrate temperature is set to 750° C., the oxygen partial pressure is set to 200 mTorr and the thin film is provided with a thickness of 8 nm by the growth time of 0.5 minute. The used laser is an excimer laser of KrF having the wavelength of 248 nm and the energy density of 5 J/cm².

Thereafter, a thin film of $PrBa_2Cu_3O_{7-\delta}$ is formed. A polycrystal body of $PrBa_2Cu_3O_{7-\delta}$ that is placed in the same chamber is used as a target. The conditions of fabricating the thin film are substantially the same as those of the $NdBa_2Cu_3O_{7-\delta}$ film where the substrate temperature is set to 750° C., the oxygen partial pressure is set to 200 mTorr and the thin film is provided with a thickness of 8 nm by the growth time of 0.5 minute (refer to FIG. 1). The multilayered film is fabricated by repeating alternately the above-described operations. Six times of the operations are repeated in the case of Embodiment 1.

Figure 2:
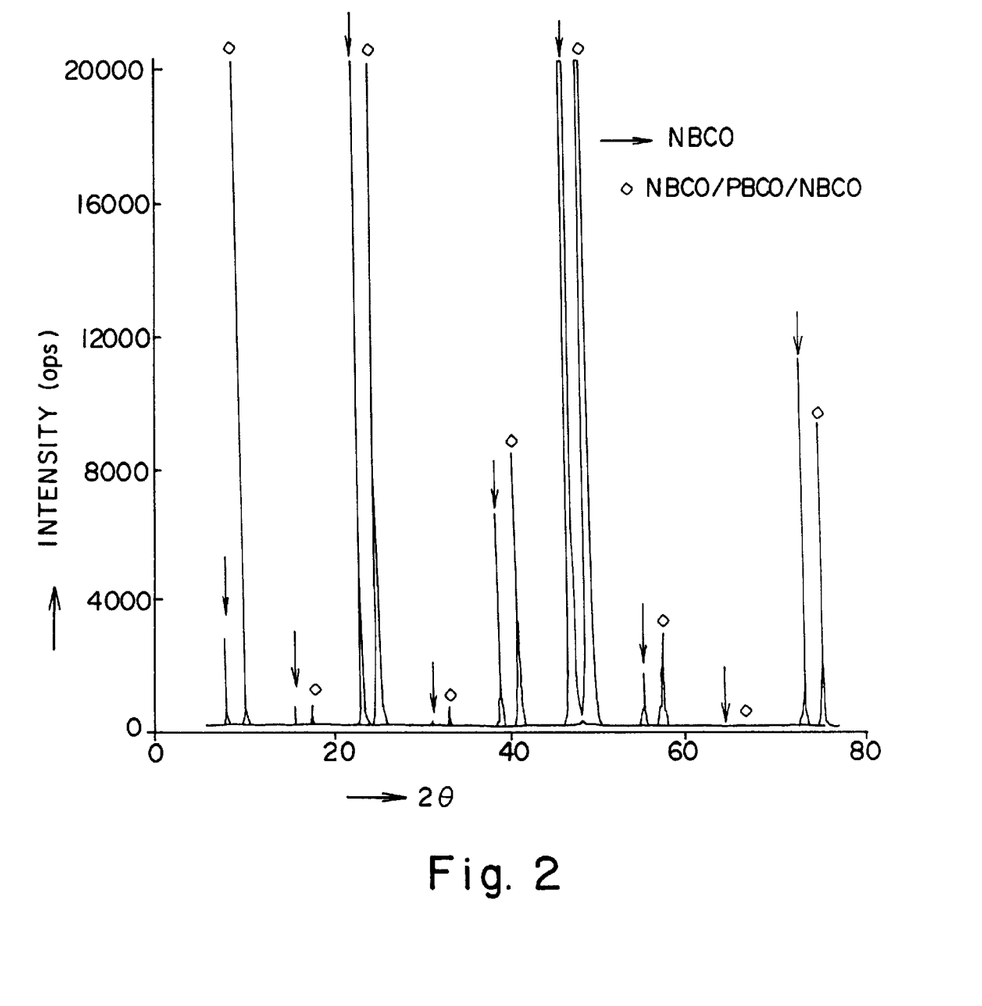
FIG. 2 is a diagram showing the $\theta$–2 $\theta$ characteristic of X-ray diffraction of the oxide superconductor multilayered film in accordance with Embodiment 1 of the present invention.

FIG. 2 indicates the θ–2θ characteristic of X-ray diffraction of the multilayered film. In addition to the characteristic, the characteristic of a single film of $NdBa_2Cu_3O_{7-\delta}$ is indicated for comparison. The c-axis orientation is provided and the intensity ratios among the diffraction peaks are the same as those of the single film of $NdBa_2Cu_3O_{7-\delta}$ whereby the lattice match performance is found to be excellent. Despite the multilayered film separation of the diffraction peaks or peaks of satellite reflection is not observed. This indicates that the multilayered film is formed with excellent match face having no interface strain crystallographically.

Figure 3:
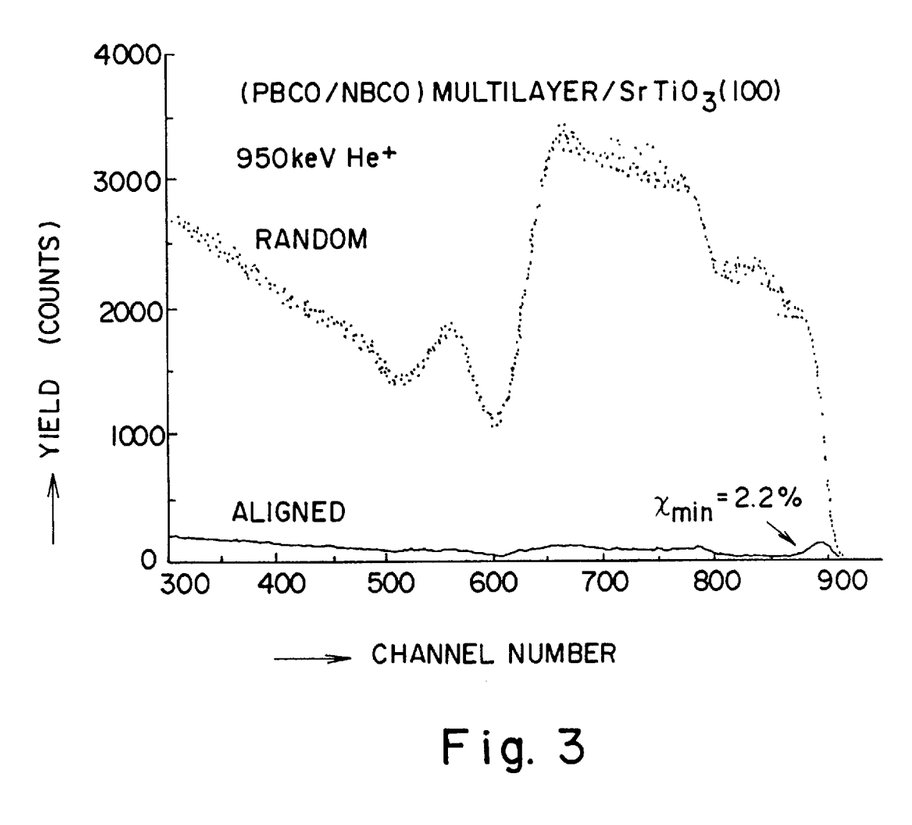
FIG. 3 is a diagram showing a result of Rutherford Backscattering (RBS) spectrometry of the oxide superconductor multilayered film in accordance with Embodiment 1.

It is known also from the result of the Rutherford Backscattering (RBS) spectrometry (FIG. 3) that an index of Xmin showing crystalline disturbance is as low as 2.2% which is comparable to the value of a high quality single crystal.

Figure 4:
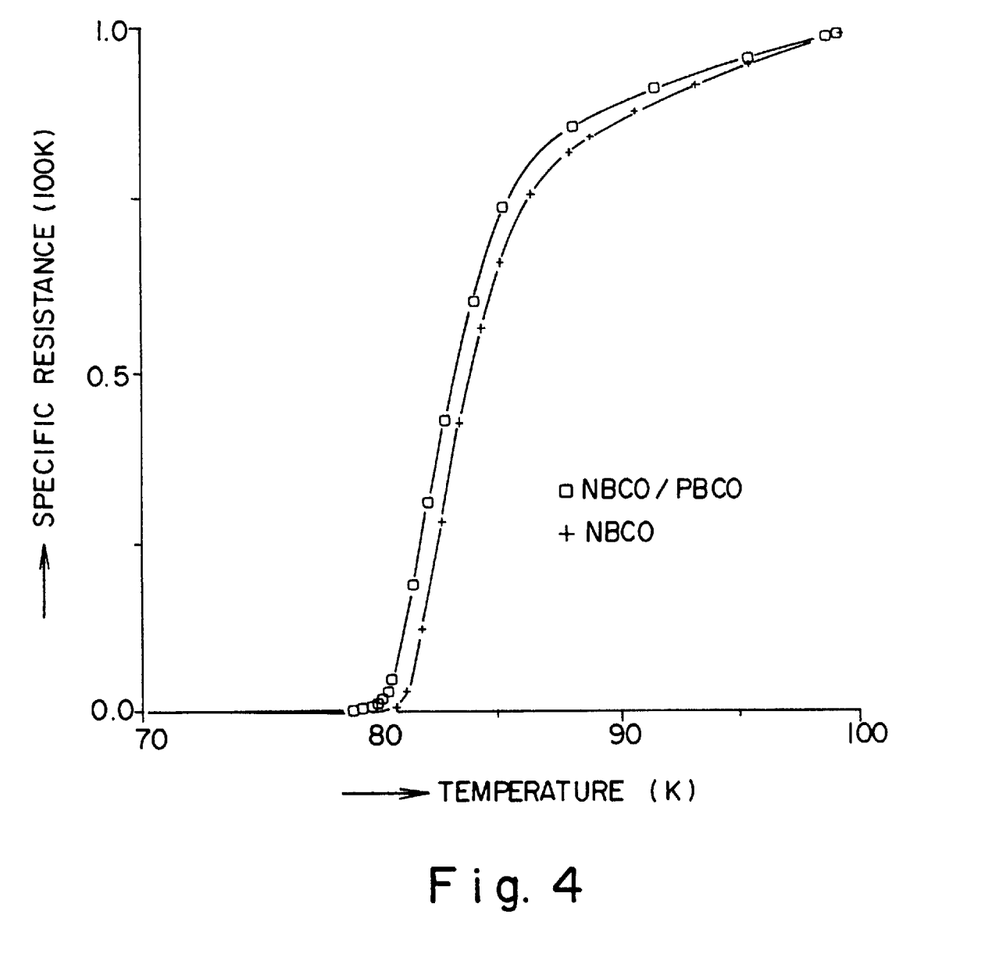
FIG. 4 is a diagram showing temperature dependency of electric resistance of the oxide superconductor multilayered film in accordance with Embodiment 1.

FIG. 4 shows the temperature dependency of the electric resistance of the provided sample. In addition thereto, the result of the single film of $NdBa_2Cu_3O_{7-\delta}$ is shown for comparison. Both films become superconductive at a temperature of 80 K or less which reveals that good quality thin films are formed. If a thin film is formed by a solid phase reaction between Nd and Pr, the critical temperature Tc is lowered. Therefore, the high critical temperature Tc indicates the separation of compositions among phases.

Embodiment 2

An explanation will be given of a method of fabricating an oxide superconductor multilayered film in accordance with Embodiment 2 of the present invention.

A device is formed by steps basically similar to those in Embodiment 1. A thin film of $SmBa_2Cu_3O_{7-\delta}$ is formed allover a substrate of $SrTiO_3$ single crystal by a sputtering process. As conditions of fabricating the thin film, a polycrystal body of $SmBa_2Cu_3O_{7-\delta}$ is used as a target, the substrate temperature is set to 740° C., the pressure of the atmosphere is set to 84 mTorr, the flow rate of oxygen gas is set to 0.5 scam, the flow rate of argon gas is set to 10 sccm and the thin film is provided with a thickness of 8 nm by the growth time of 1 minute.

Thereafter, a thin film of $ScBa_2Cu_3O_{7-\delta}$ is formed all over the substrate by a sputtering process. A polycrystal body of $ScBa_2Cu_3O_{7-\delta}$ is used as a target, the substrate temperature is set to 740 C, the pressure of the atmosphere is set to 84 mTorr, the flow rate of oxygen gas is set to 0.5 sccm, the flow rate of argon gas is set to 10 sccm and the thin film is provided with a thickness of 8 nm by the growth time of 1 minute. A multilayered film is fabricated by alternately repeating the above-described operations.

Figure 5:
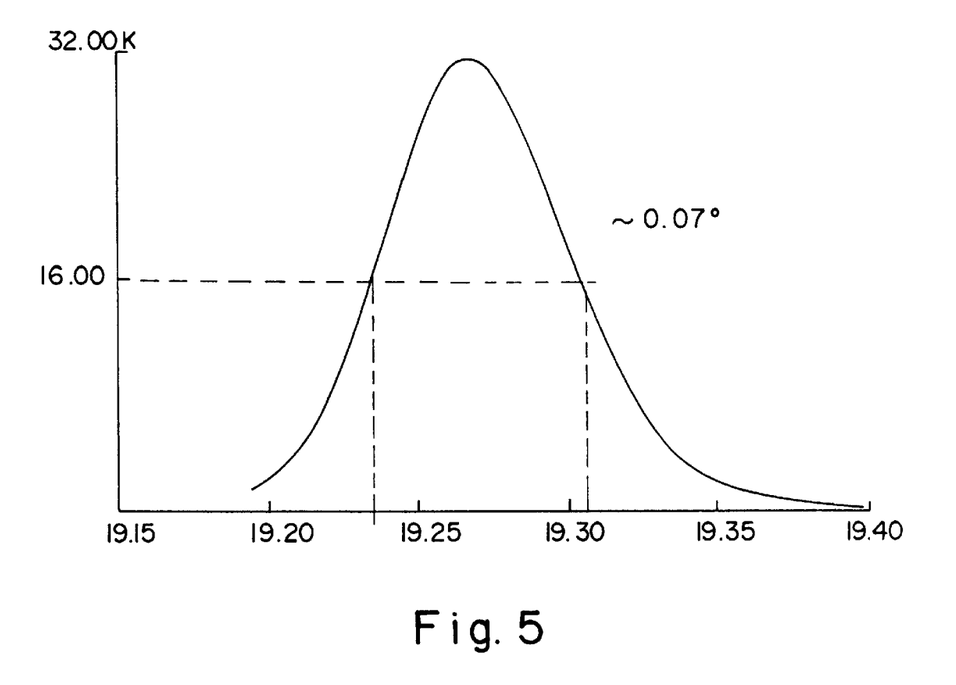
FIG. 5 is a diagram showing a rocking curve of (005) X-ray diffraction peak of the oxide superconductor multilayered film in accordance with Embodiment 1 of the present invention.

Fifteen times of the operations are repeated in the case of Embodiment 2. FIG. 5 indicates a rocking curve of (005) X-ray diffraction peak. The half value width is 0.070 whereby a high quality film having no defect is found to be formed.

According to the above-described explanation, an explanation has been given of the oxide superconductor multilayered films where the oxide superconductor thin films represented by the chemical formula of $M'Ba_2Cu_3O_{7-\delta}$ (here, M' designates Nd, Sm, Eu or an alloy of these) and the oxide thin films represented by the chemical formula of $M^*Ba_2Cu_3O_{7-\delta}$ (here, M* designates Pr, Sc or an alloy of these), are alternately stacked. It can easily be predicted from the above-described explanation of the present invention that an element of M' in the chemical formula may be a rare earth element of Nd, Sm, Eu etc. or an alloy of these.

Although a specific explanation has been given of the present invention based on the embodiments as described above, the present invention is not naturally limited to the embodiments but may naturally be modified variously within the range where the gist of the invention is not deviated.

Next, an explanation will be given of other embodiments of the present invention. Here, only representative examples will be described and the scope of claim is not limited thereby. An oxide superconductor is provided with a low concentration of carriers and therefore, the electric properties are strongly dependent on the content of oxygen supplying hole carriers. In the meantime the amount of oxygen is highly related to the lattice strain. Accordingly, under a strained state the oxygen depletion is caused whereby the superconductive properties are deteriorated. Meanwhile, when different materials are combined, internal strain is generally caused from an interface of bonding by a difference in the lattice constants or the thermal expansion coefficients. Not only the mechanical strength is weakened thereby but the superconductive properties are deteriorated in an oxide superconductive material. Accordingly, it is important for forming such a laminated layer structure to reduce as less as possible the strain and realize the inherent superconductive performance having high function up to boundaries of the interface. The present invention has paid attention to the problem and found one of the most pertinent materials. An explanation thereof will be given based on embodiments as follows.

Embodiment 3

Figure 6A:
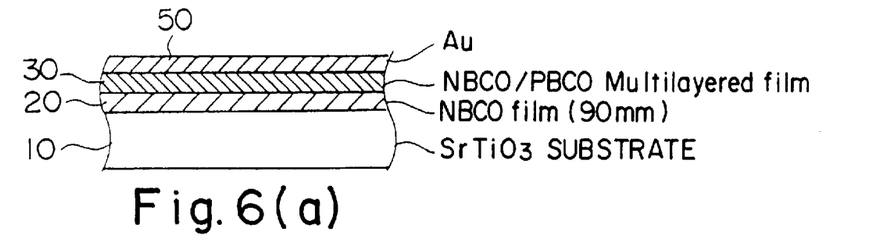
FIGS. 6(a), 6(b), 6(c), 6(d) and 6(e) are diagrams showing the outline of a fabricated junction structure comprising multilayers and the fabrication process.

FIGS. 6(a), 6(b), 6(c), 6(d) and 6(e) show the outline of a fabricated junction structure comprising multilayers and steps of fabrication. Firstly, as shown by FIG. 6(a), a thin film 20 of $NdBa_2Cu_3O_7$ which is an oxide superconductor is formed all over a substrate 10 of $SrTiO_3$ single crystal by a pulsed laser deposition process (hereinafter, referred to as NBCO).

As conditions of fabricating the thin film, a polycrystal body of $NdBa_2Cu_3O_7$ is used as a target, the substrate temperature is set to 790° C., the oxygen partial pressure is set to 100 mTorr and the film is provided with the film thickness of 80 nm by the growth time of 5 minutes. The used laser is an excimer laser of KrF having a wavelength of 248 nm and the energy density of 5 $J/cm^2$.

Thereafter, a thin film of $PrBa_2Cu_3O_7$ that is a non-superconductor constituting a tunnel barrier is fabricated in vacuum (hereinafter, referred to as PBCO). A polycrystal body of $PrBa_2Cu_3O_7$ that is present in the same chamber is used as a target. The conditions of fabricating the thin film are substantially the same as those of $NdBa_2Cu_3O_7$ wherein the substrate temperature is set to 790° C., the oxygen partial pressure is set to 100 mTorr and the film is provided with the film thickness of 80 nm by the growth time of 5 minutes. A multilayered film 30 is formed by alternately repeating these operations. Five times of the operations are repeated in the case of Embodiment 3.

For example, the film thickness of the NBCO layer 20 deposited onto the STO substrate 10 is 80 nm, the film thickness of the PBCO layer that is the lowest layer constituting the multilayered film is 80 nm and the film thickness of the NBCO layer thereon is 45 nm, the film thickness of the PBCO layer thereon is 45 nm and the film thickness of the NBCO layer of the uppermost layer is 80 nm. Finally, a gold layer 50 which is to constitute a take-out electrode is stacked all over the face by a vapor deposition process. These steps are carried out without breaking vacuum to prevent the interface resistance from increasing by contamination.

Figure 6B:
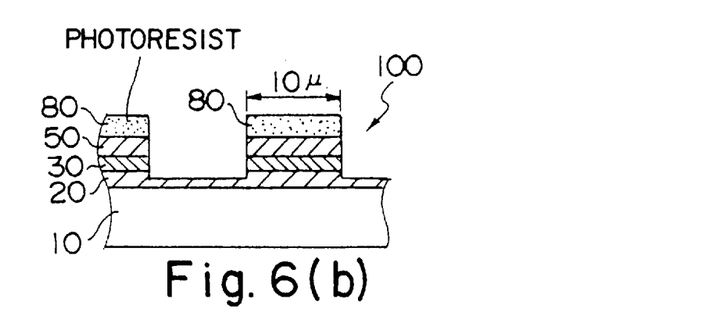
Figure 6C:
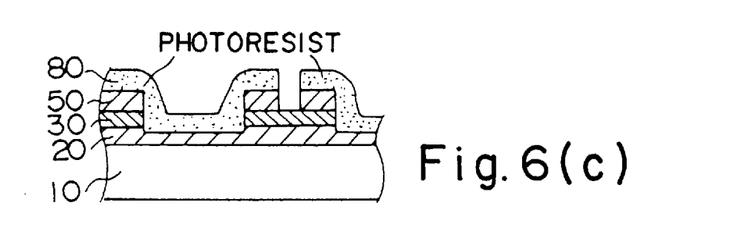
Figure 6D:
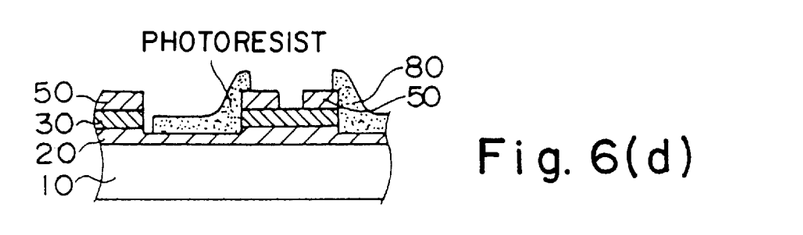
Figure 6E:
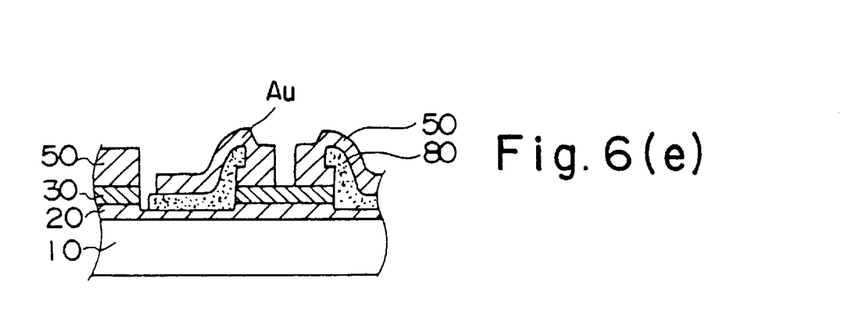

Next, the films are removed while leaving a portion 100 having a square area of 10 $\mu m^2$ and a lower electrode 70 by normal photolithography and Ar ion etching. The portion 100 having the square area of 10 $\mu m^2$ constitutes a junction. Thereafter, an insulating film is formed by a photoresist 80 as shown by FIG. 6(b), the insulating film is partially removed as shown by FIG. 6(c) and gold electrodes are formed as shown by FIG. 6(d). Further, wires are bonded to the gold electrode as shown by FIG. 6(e). The sample is prepared for measuring the current/voltage characteristic by the four terminals method.

Figure 7:
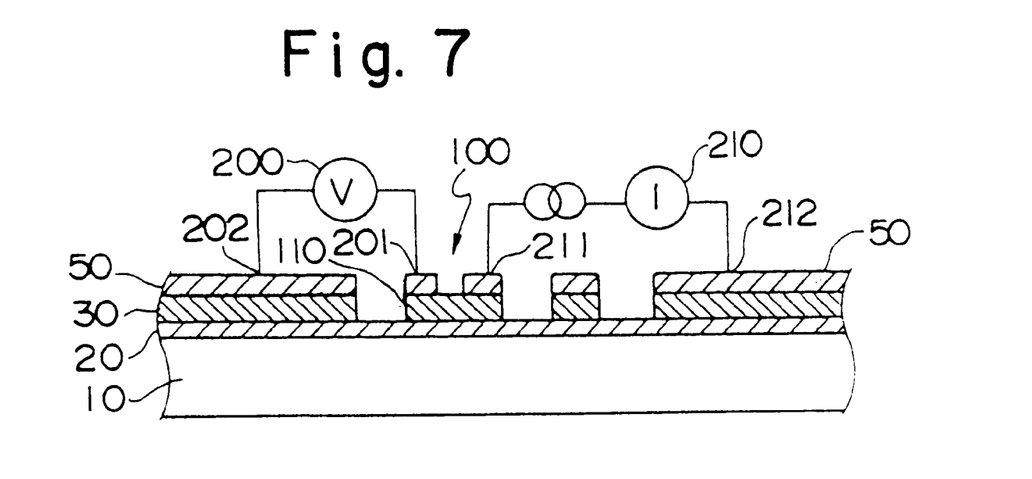
FIG. 7 is a structural view of a device current/voltage characteristic of a sample by using the four terminals method.

FIG. 7 shows a device for measuring the current/voltage characteristic through the four terminals method by using the sample prepared by the above-described steps.

A first terminal 201 is brought into contact with one of the gold electrodes of the junction 100 and a second terminal 202 is brought into contact with the gold electrode other than those of the junction whereby a voltage is measured by a voltmeter 200.

A third terminal 211 is brought into contact with the other one of the gold electrodes at the junction 100 and a fourth terminal 212 is brought into contact with the gold electrode other than those of the junction whereby a current is measured by an ampere meter 210.

Figure 8:
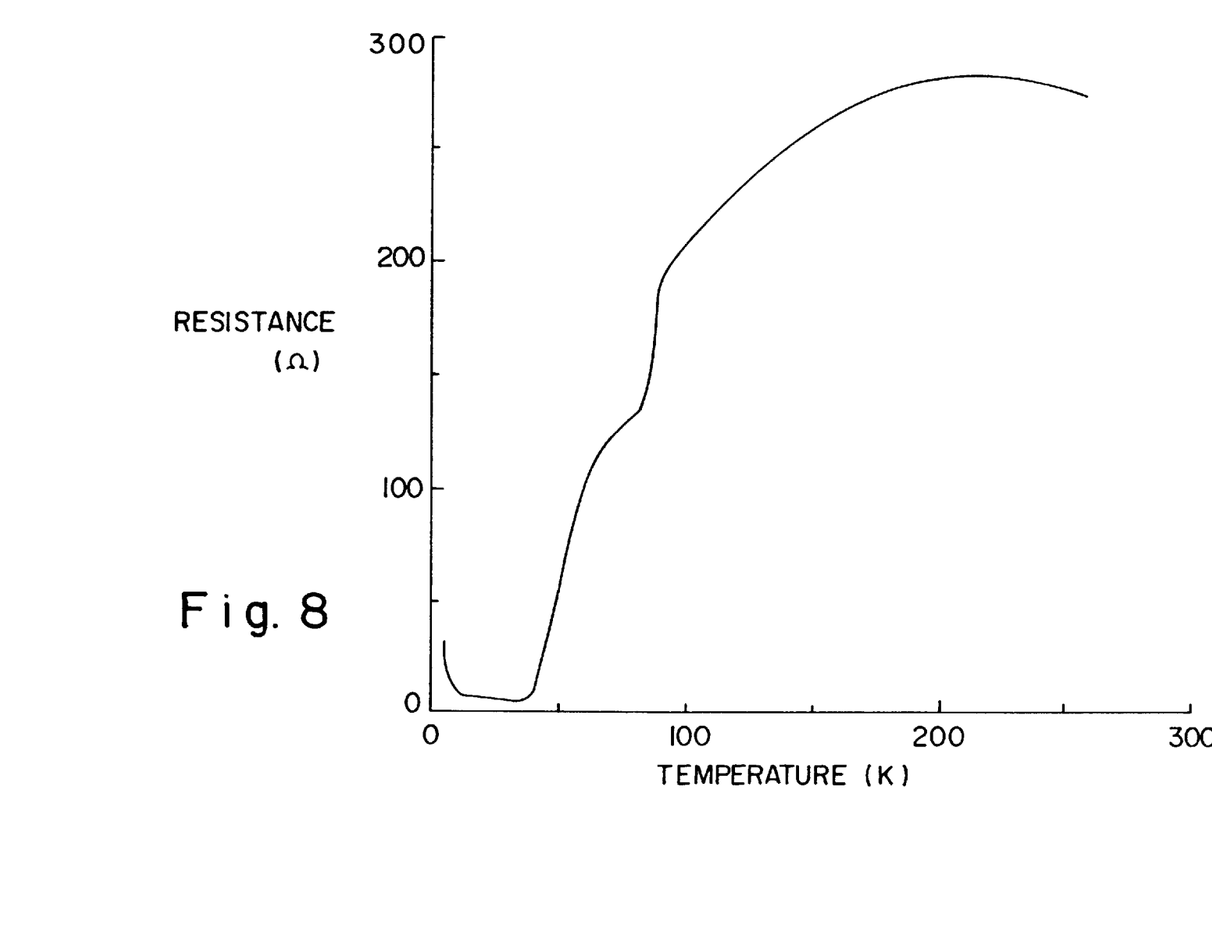
FIG. 8 is a diagram showing the temperature dependency of the electric resistance of sample.
Figure 9:
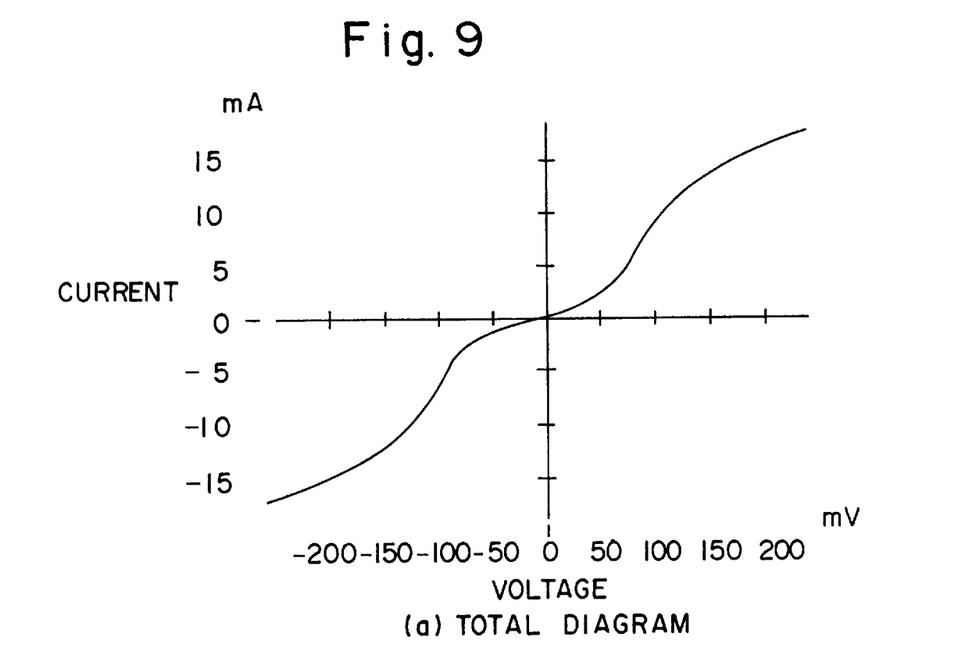
FIG. 9 illustrates the current/voltage characteristics at 4.2 K by the four terminals method.
Figure 10:
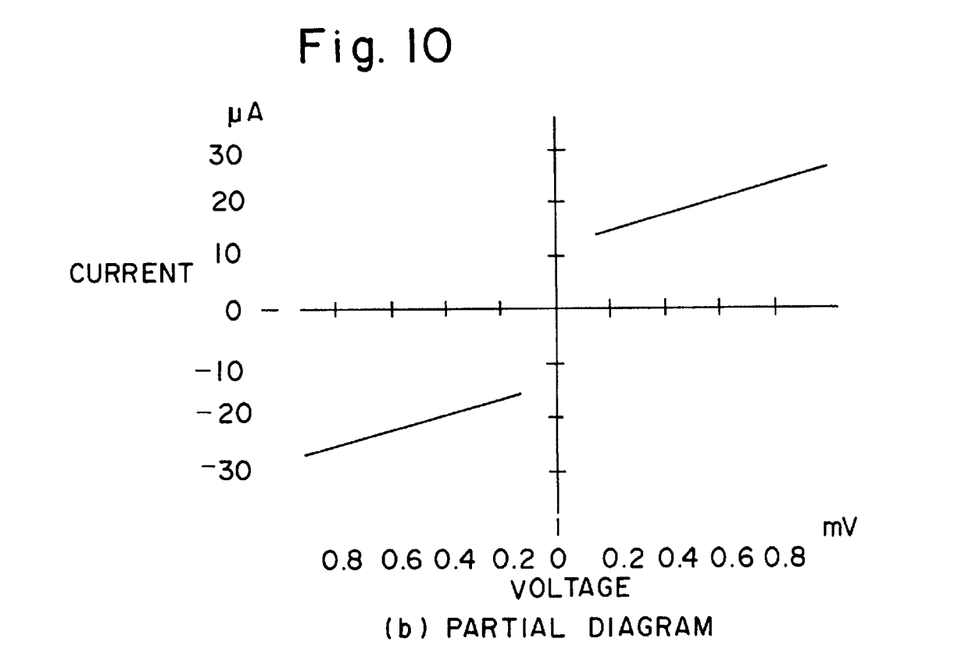
FIG. 10 is an enlarged diagram o f FIG. 9.

FIG. 8 indicates the temperature dependency of the electric resistance of the prepared sample. The sample becomes superconductive at a temperature of 90 K or less whereby a thin film having the good quality junction 110 is found to be formed. A result of measuring the current/voltage characteristic at 4.2 K by the four terminals method is shown by FIG. 9 and FIG. 10 which is an enlarged diagram of FIG. 9. An abrupt increase of current is observed at 50 mV corresponding to a superconductive tunnel current and a superconductive energy gap voltage whereby the quasi particle tunnel characteristic is found to be achieved.

Figure 11:
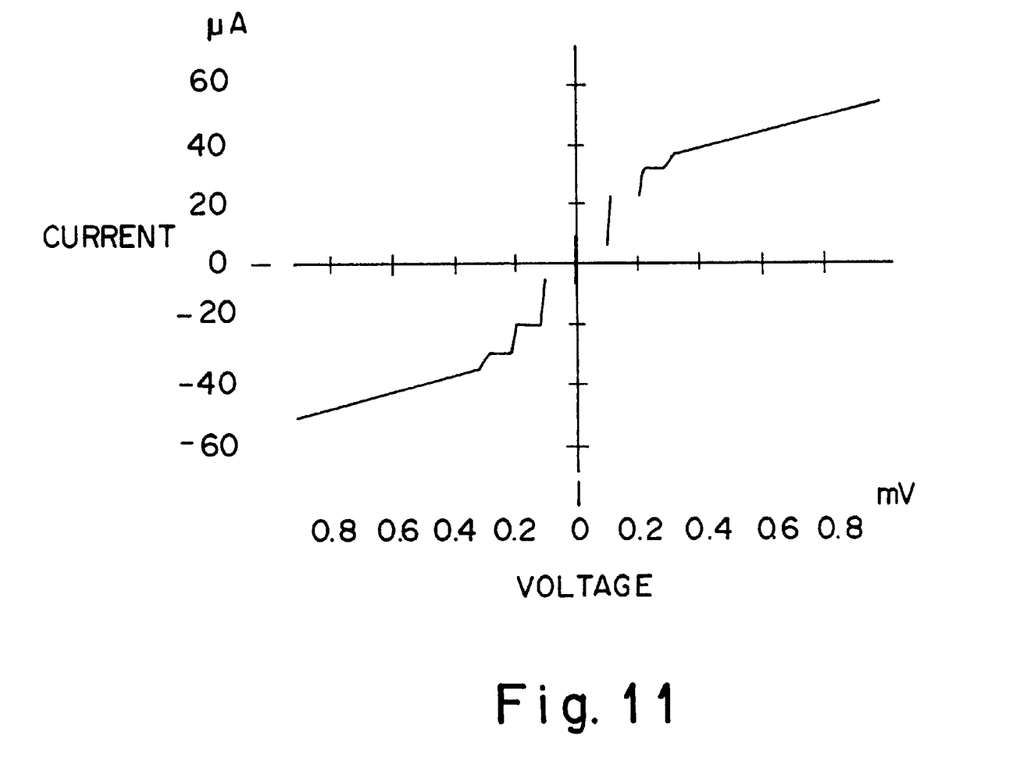
FIG. 11 is a diagram showing the current/voltage characteristic when a microwave of 9.3 GHz is irradiated.

FIG. 11 indicates a measurement result of the current/voltage characteristic when a microwave of 9.3 GHz is irradiated on the device according to the embodiment of the present invention. The superconductive current is decreased. Further, a stepped portion is observed at substantially 100 $\mu V$. The value coincides with a value approximately 5 times as much as a value (18 $\mu V$) derived from the AC (Alternating Current) Josephson effect in respect of 9.3 GHz, which signifies the Shapiro step. That is, a Josephson junction is formed.

Embodiment 4

A device is formed by steps basically similar to those in Embodiment 3. A thin film of $SmBa_2Cu_3O_7$ is formed all over a substrate of $SrTiO_3$ single crystal. As conditions of forming the thin film, a polycrystal body of $SmBa_2Cu_3O_7$ is used as a target, the substrate temperature is set to 740° C., the pressure of the atmosphere is set to 84 mTorr, the flow rate of oxygen gas is set to 0.5 sccm, the flow rate of argon gas is set to 10 sccm and the film is provided with the film thickness of 80 nm by the growth time of 10 minutes. The used RF (Radio Frequency) power is 80 W.

Thereafter, a thin film of $ScBa_2Cu_3O_7$ is formed all over the substrate by a sputtering process. A polycrystal body of $ScBa_2Cu_3O_7$ is used as a target, the substrate temperature is set to 740° C., the pressure of the atmosphere is set to 84 mTorr, the flow rate of oxygen gas is set to 0.5 sccm, the flow rate of argon gas is set to 10 sccm and the film is provided with the film thickness of 80 nm by the growth time of 10 minutes. And a layer of $SmBa_2Cu_3O_7$ is stacked thereon under the same conditions.

Next, the films are removed while leaving a portion of a square area of 10 $\mu m^2$ and a lower electrode by normal photolithography and Ar ion etching. The portion of the square area of 10 $\mu m^2$ constitutes a junction. Next, an insulating film is formed, the insulating film is partially removed and gold electrodes are formed. Further, wires are bonded to the gold electrodes. The sample is prepared for measuring the current/voltage characteristic by the four terminals method. The current/voltage characteristic similar to that in Embodiment 3 is observed also in respect of the junction whereby a tunnel type junction is found to be fabricated.

According to the present invention, the film is constituted by layers having inconsiderable lattice mismatch performance and therefore, a superconductive multilayered thin film structure of high quality having no internal stress is provided. Therefore, superconductive wirings where a large current can be made to flow, can be obtained, which becomes a basic technology in realizing a superconductive circuit.

According to the present invention, the film is constituted by layers having almost perfect lattice matching and accordingly, a superconductive tunnel junction of high quality having no internal stress is provided. Therefore, a basic technology in realizing a superconductive circuit is achieved.

We claim:

1. An oxide superconductor multilayered film showing hybridization of SNS and SIS type current-voltage characteristics comprising a laminated layer structure where oxide superconductor thin films represented by a chemical formula of $M'Ba_2Cu_3O_{7-\delta}$ where a notation M' designates a rare earth element selected from the group consisting of Nd, Sm, Eu and alloys thereof and a notation $\delta$ designates an oxygen depletion amount, oxide thin films represented by a chemical formula of $M^*Ba_2Cu_3O_{7-\delta}$ where a notation M* designates an element selected from the group consisting of Pr, Sc and alloys of these and the notation $\delta$ designates an oxygen depletion amount, are alternately stacked.

2. The oxide superconductor multilayered film according to claim 1, wherein the oxide thin films are thin films prepared by a pulsed laser deposition process or a sputtering process.

3. An oxide superconductor multilayer film according to claim 1, wherein M' is Nd, and M* is Pr.

4. An oxide superconductor multilayer film according to claim 1, wherein M' is Sm and M* is Sc.

5. An oxide superconductor Josephson device showing hybridization of SNS and SIS type current-voltage characteristics:

wherein a junction formed on a substrate comprises a laminated layer structure where thin film layers of an oxide superconductor and thin film layers of a non-superconductor are alternately laminated;

wherein the oxide superconductor constitutes a thin film of the oxide superconductor represented by a chemical formula of $M'Ba_2Cu_3O_7$ where a notation M' designates a rare earth element selected from the group consisting of Nd, Sm, Eu and alloys thereof; and wherein the non-superconductor constitutes a thin film of an oxide represented by a chemical formula of $M^*Ba_2Cu_3O_7$ where a notation M* designates an element selected from the group consisting of Pr, Sc and alloys thereof.

6. The oxide superconductor Josephson device according to claim 5, wherein the laminated layer structure is formed by a pulsed laser deposition process.

7. The oxide superconductor Josephson device according to claim 5, wherein the laminated layer structure is formed by a sputtering process.

8. An oxide superconductor Josephson device according to claim 5, wherein M' is Nd, and M* is Pr.

9. An oxide superconductor Josephson device according to claim 5, wherein M' is Sm and M* is Sc.

* * * * *